(12) United States Patent
Choi et al.

(10) Patent No.: US 10,283,529 B2
(45) Date of Patent: May 7, 2019

(54) METHOD OF MANUFACTURING THIN-FILM TRANSISTOR, THIN-FILM TRANSISTOR SUBSTRATE, AND FLAT PANEL DISPLAY APPARATUS

(71) Applicant: SAMSUNG DISPLAY CO., LTD., Yongin-si, Gyeonggi-Do (KR)

(72) Inventors: Shinil Choi, Yongin-si (KR); Hyunmin Cho, Yongin-si (KR); Sanggab Kim, Yongin-si (KR); Sunghoon Yang, Yongin-si (KR); Yugwang Jeong, Yongin-si (KR); Byungdu Ahn, Yongin-si (KR)

(73) Assignee: SAMSUNG DISPLAY CO., LTD., Yongin-si, Gyeonggi-Do (KR)

( * ) Notice: Subject to any disclaimer, the term of this patent is extended or adjusted under 35 U.S.C. 154(b) by 246 days.

(21) Appl. No.: 15/337,401

(22) Filed: Oct. 28, 2016

(65) Prior Publication Data

US 2017/0179164 A1    Jun. 22, 2017

(30) Foreign Application Priority Data

Dec. 21, 2015   (KR) .......................... 10-2015-0182791

(51) Int. Cl.
*G02F 1/1368*    (2006.01)
*H01L 27/12*     (2006.01)
(Continued)

(52) U.S. Cl.
CPC ........ *H01L 27/1225* (2013.01); *G02F 1/1368* (2013.01); *G02F 1/13439* (2013.01);
(Continued)

(58) Field of Classification Search
CPC ............................................. G02F 2001/13685
(Continued)

(56) References Cited

U.S. PATENT DOCUMENTS 9,412,876 B2    8/2016  Koezuka et al.
2002/0008797 A1*  1/2002  Yamazaki ......... G02F 1/134363
                                                    349/43
(Continued)

FOREIGN PATENT DOCUMENTS

KR   10-2014-0076471   6/2014
KR   10-2014-0139773   12/2014
(Continued)

*Primary Examiner* — Lucy P Chien
(74) *Attorney, Agent, or Firm* — F. Chau & Associates, LLC

(57) ABSTRACT

A method of manufacturing a thin-film transistor includes forming an oxide semiconductor on a substrate, stacking an insulating layer and a metal layer on the substrate to cover the oxide semiconductor, forming a photosensitive pattern on the metal layer, forming a gate electrode by etching the metal layer using the photosensitive pattern as a mask, where a part of the gate electrode overlaps a first oxide semiconductor region of the oxide semiconductor, forming a gate insulating film by partially etching the insulating layer using the photosensitive pattern as a mask, where the gate insulating film includes a first insulating region with a first thickness under the photosensitive pattern and a second insulating region with a second thickness less than the first thickness, and performing plasma processing on the gate insulating film so that a second oxide semiconductor region of the oxide semiconductor under the second insulating region becomes conductive.

17 Claims, 13 Drawing Sheets

(51) Int. Cl.
*G02F 1/1333* (2006.01)
*G02F 1/1343* (2006.01)
*G02F 1/1362* (2006.01)
*H01L 27/32* (2006.01)
*H01L 29/423* (2006.01)
*H01L 29/66* (2006.01)
*H01L 29/786* (2006.01)

(52) U.S. Cl.
CPC .. *G02F 1/133345* (2013.01); *G02F 1/134309* (2013.01); *G02F 1/136227* (2013.01); *H01L 27/124* (2013.01); *H01L 27/1248* (2013.01); *H01L 27/1262* (2013.01); *H01L 27/1288* (2013.01); *H01L 27/3258* (2013.01); *H01L 27/3262* (2013.01); *H01L 29/42384* (2013.01); *H01L 29/66969* (2013.01); *H01L 29/7869* (2013.01); *H01L 29/78618* (2013.01); *G02F 2001/13685* (2013.01); *G02F 2201/123* (2013.01); *H01L 2029/42388* (2013.01); *H01L 2227/323* (2013.01)

(58) Field of Classification Search
USPC .......................................................... 349/47
See application file for complete search history.

(56) References Cited

U.S. PATENT DOCUMENTS

| | | | |
|---|---|---|---|
| 2012/0218495 A1* | 8/2012 | Oshima | H01L 27/1225 349/61 |
| 2014/0353660 A1 | 12/2014 | Jung et al. | |
| 2015/0206932 A1 | 7/2015 | Cha et al. | |

FOREIGN PATENT DOCUMENTS

| | | |
|---|---|---|
| KR | 10-2015-00034077 | 4/2015 |
| KR | 10-2015-0086631 | 7/2015 |
| KR | 10-2015-0093616 | 8/2015 |

* cited by examiner

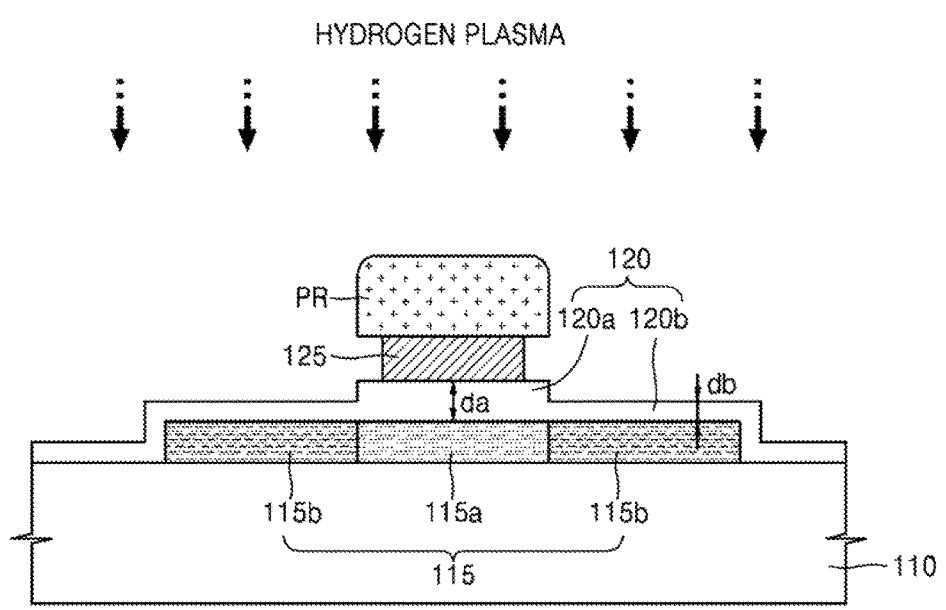

METHOD OF MANUFACTURING THIN-FILM TRANSISTOR, THIN-FILM TRANSISTOR SUBSTRATE, AND FLAT PANEL DISPLAY APPARATUS

CROSS-REFERENCE TO RELATED APPLICATION

This application claims priority under 35 U.S.C. § 119 from, and the benefit of, Korean Patent Application No. 10-2015-0182791, filed on Dec. 21, 2015 in the Korean Intellectual Property Office, the contents of which are herein incorporated by reference in their entirety.

BACKGROUND

1. Field

One or more embodiments are directed to a method of manufacturing a thin-film transistor (TFT), a TFT substrate, and a flat panel display apparatus, and more particularly, to a method of manufacturing a TFT using an oxide semiconductor, and a TFT substrate and a flat panel display apparatus that include a TFT manufactured using the method.

2. Description of the Related Art

A flat panel display apparatus such as an organic light-emitting diode display apparatus or a liquid-crystal display (LCD) apparatus includes at least one thin-film transistor (TFT), a capacitor, and a wiring line that connects the at least one TFT and the capacitor to each other. Each of the at least one TFT includes an active layer that includes a channel region, a source region, and a drain region, and a gate electrode on the channel region that is electrically insulated from the active layer by a gate insulating layer.

The active layer of the TFT is generally formed of a semiconductor material such as amorphous silicon or poly-silicon. When the active layer is formed of amorphous silicon, a mobility of the TFT is low, and thus a driving circuit may not operate at a high speed. When the active layer is formed of poly-silicon, although a mobility of the TFT is high, a threshold voltage is non-uniform and an additional compensation circuit is required. In addition, since a conventional method of manufacturing a TFT using low temperature poly-silicon (LTPS) uses an expensive laser heat treatment, investment and equipment management costs are high, particularly for large-sized substrates.

SUMMARY

Additional features will be set forth in part in the description which follows and, in part, will be apparent from the description, or may be learned by practice of the presented embodiments.

According to one or more embodiments, a method of manufacturing a thin-film transistor (TFT) includes: forming an oxide semiconductor pattern on a substrate; sequentially stacking an insulating material layer and a metal layer on the substrate that covers the oxide semiconductor pattern; forming a photosensitive pattern on the metal layer; forming a gate electrode by etching the metal layer using the photosensitive pattern as a mask, where at least one part of the gate electrode overlaps a first oxide semiconductor region of the oxide semiconductor pattern; forming a gate insulating film by partially etching the insulating material layer using the photosensitive pattern as a mask, where the gate insulating film includes a first insulating region with a first thickness under the photosensitive pattern and a second insulating region with a second thickness less than the first thickness; and performing plasma processing on the gate insulating film where a second oxide semiconductor region of the oxide semiconductor pattern under the second insulating region becomes conductive.

The plasma processing uses a hydrogen-containing gas.

The second thickness may range from about 500 Å to about 1000 Å.

The method may further include: removing the photosensitive pattern; forming an interlayer insulating film on the gate electrode and the gate insulating film; forming a contact hole through which a part of the second oxide semiconductor region is exposed, by etching the gate insulating film and the interlayer insulating film; and forming an electrode through the contact hole that is electrically connected to the exposed part of the second oxide semiconductor region.

Forming the gate electrode may include wet etching the metal layer using the photosensitive pattern as a mask, where a side surface of the gate electrode is disposed inward from a side surface of the photosensitive pattern.

Forming the gate insulating film may include partially dry etching the insulating material layer by using the photosensitive pattern as a mask, where an edge of the photosensitive pattern corresponds to a boundary between the first and second insulating regions.

The first insulating region may include a central portion covered by the gate electrode and an edge portion not covered by the gate electrode.

Performing the plasma processing may include: removing the photosensitive pattern; and performing plasma processing using the gate electrode as a mask to form the oxide semiconductor pattern, including the first oxide semiconductor region under the central portion of the first insulating region, a third oxide semiconductor region under the edge portion of the first insulating region, and the conductive second oxide semiconductor region under the second insulating region, wherein the third semiconductor region has a resistance less than a resistance of the first oxide semiconductor region and greater than a resistance of the second oxide semiconductor region.

According to one or more embodiments, a thin-film transistor (TFT) substrate includes: a substrate; an oxide semiconductor pattern disposed on the substrate and that includes a semiconducting first oxide semiconductor region and a conductive second oxide semiconductor region; a gate insulating film disposed on the substrate that covers the oxide semiconductor pattern and that includes a first insulating region with a first thickness and a second insulating region with a second thickness less than the first thickness; a gate electrode disposed on the first insulating region, where at least a part of the gate electrode overlaps the first oxide semiconductor region; and an interlayer insulating film disposed on the gate insulating film that cover the gate electrode, where the second oxide semiconductor region became conductive from a hydrogen gas based plasma process performed on the gate electrode and gate insulating film The TFT substrate may further include an electrode disposed on the interlayer insulating film that is electrically connected to the second oxide semiconductor region through a contact plug that penetrates the interlayer insulating film and the gate insulating film.

The second thickness may range from about 500 Å to about 1000 Å.

The first insulating region may include a central portion covered by the gate electrode and an edge portion not covered by the gate electrode.

The oxide semiconductor pattern may include a third oxide semiconductor region disposed between the first and second oxide semiconductor regions and that has a resistance less than a resistance of the first oxide semiconductor region and greater than a resistance of the second oxide semiconductor region.

According to one or more embodiments, a flat panel display apparatus includes: a substrate; an oxide semiconductor pattern disposed on the substrate and that includes a semiconducting first oxide semiconductor region and a conductive second oxide semiconductor region; a gate insulating film disposed on the substrate that covers the oxide semiconductor pattern and that includes a first insulating region with a first thickness and a second insulating region with a second thickness less than the first thickness; a gate electrode disposed on the first insulating region, where at least a part of the gate electrode overlaps the first oxide semiconductor region; an interlayer insulating film disposed on the gate insulating film that covers the gate electrode; and an electrode disposed in the interlayer insulating film that is electrically connected to the second oxide semiconductor region through a contact plug that penetrates the interlayer insulating film and the gate insulating film.

The second oxide semiconductor region may become conductive from a hydrogen gas based plasma process performed on the gate electrode and gate insulating film.

The second thickness may range from about 500 Å to about 1000 Å.

The first insulating region may include a central portion covered by the gate electrode and an edge portion not covered by the gate electrode.

The oxide semiconductor pattern may include a third oxide semiconductor region disposed between the first and second oxide semiconductor regions and that has a resistance less than a resistance of the first oxide semiconductor region and greater than a resistance of the second oxide semiconductor region.

The flat panel display apparatus may further include: a pixel electrode electrically connected to the electrode; a counter electrode that faces the pixel electrode; and an organic emission layer disposed between the pixel electrode and the counter electrode.

The flat panel display apparatus may further include: a pixel electrode electrically connected to the electrode; a counter electrode that faces the pixel electrode; and a liquid crystal layer disposed between the pixel electrode and the counter electrode.

BRIEF DESCRIPTION OF THE DRAWINGS

FIGS. 2A through 2H are cross-sectional views that sequentially illustrate a method of manufacturing a TFT according to an embodiment.

DETAILED DESCRIPTION

Figure 1:
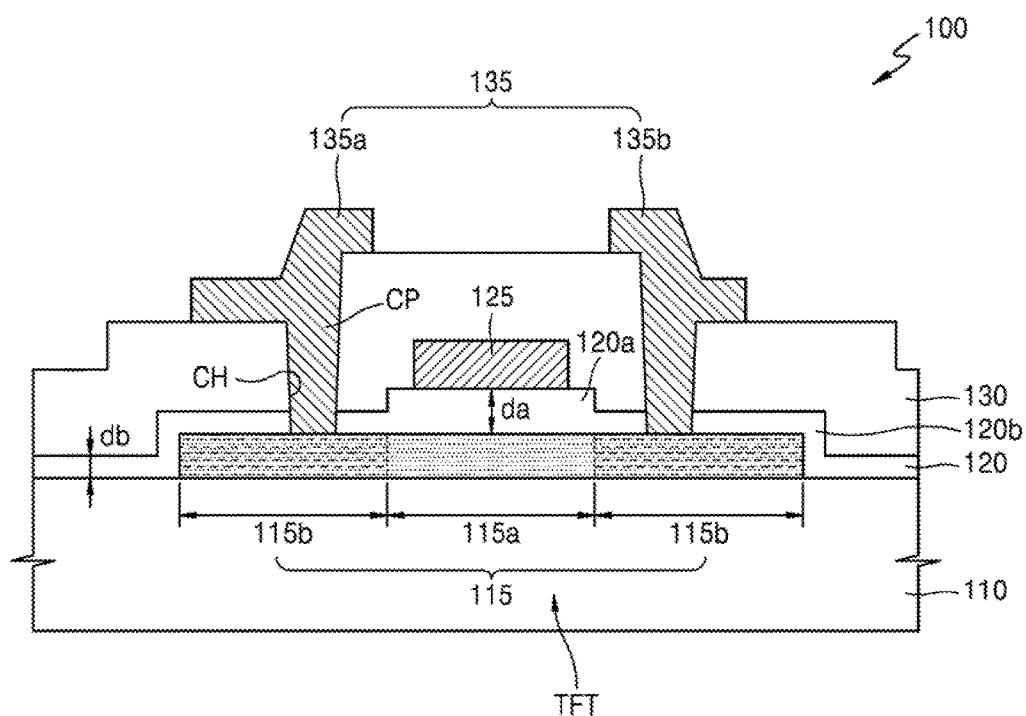
FIG. 1 is a cross-sectional view of a thin-film transistor (TFT) substrate according to an embodiment.

Embodiments of the inventive concept may include various embodiments and modifications, and embodiments thereof will be illustrated in the drawings and will be described herein in detail. The features of the inventive concept and methods of achieving the features will be described more fully with reference to the accompanying drawings, in which exemplary embodiments of the inventive concept are shown. The inventive concept may, however, be embodied in many different forms and should not be construed as being limited to the embodiments set forth herein.

It will be further understood that the terms "comprises" and/or "comprising" used herein specify the presence of stated features or components, but do not preclude the presence or addition of one or more other features or components.

It will be understood that when a layer, region, or element is referred to as being "formed on", another layer, region, or element, it can be directly or indirectly formed on the other layer, region, or element.

Sizes of elements may be exaggerated for convenience of explanation.

Reference will now be made in detail to exemplary embodiments, examples of which are illustrated in the accompanying drawings. In the drawings, the same elements may be denoted by the same reference numerals, and a repeated explanation thereof will not be given.

FIG. 1 is a cross-sectional view of a thin-film transistor (TFT) substrate 100 according to an embodiment.

Referring to FIG. 1, a TFT substrate 100 includes a substrate 110, an oxide semiconductor pattern 115, a gate insulating film 120, a gate electrode 125, an interlayer insulating film 130, and an electrode 135. The oxide semiconductor pattern 115 is disposed on the substrate 110, and includes a first oxide semiconductor region 115a with semiconducting properties and a second oxide semiconductor region 115b with conductive properties. The gate insulating film 120 is disposed on the substrate 110 to cover the oxide semiconductor pattern 115. The gate insulating film 120 includes a first insulating region 120a with a first thickness da and a second insulating region 120b with a second thickness db that is less than the first thickness da. The gate electrode 125 is disposed on the first insulating region 120a, and at least a part of the gate electrode 125 overlaps the first oxide semiconductor region 115a. The interlayer insulating film 130 is disposed on the gate insulating film 120 to cover the gate electrode 125. The electrode 135 is disposed on the interlayer insulating film 130 and is electrically connected to the second oxide semiconductor region 115b through a contact plug CP that penetrates the interlayer insulating film 130. The oxide semiconductor pattern 115 and the gate electrode 125 may constitute a top gate-type TFT.

The TFT substrate 100 is part of an apparatus that includes at least one TFT on the substrate 110. The TFT substrate 100 may be a flat panel display apparatus in which pixels that include TFTs are arranged in a matrix. For example, the TFT substrate 100 may be an organic light-emitting diode display apparatus or a liquid crystal display (LCD) apparatus.

The substrate 110 supports the entire TFT substrate 100 and maintains the stiffness of the TFT substrate 100. The substrate 110 may have a flat top surface and may be formed of a transparent insulating material. For example, the substrate 110 can be formed of glass. However, embodiments of the inventive concept are not limited thereto, and the substrate 110 may be formed of a plastic material such as polyethylene terephthalate (PET), polyethylene naphthalate (PEN), polyimide (PI), polyethersulfone (PES), or polyacrylate (PAR). The substrate 110 may be formed of an opaque material such as a metal or a carbon fiber, and to realize a flexible display apparatus, the substrate 110 may be formed of a flexible plastic material such as a PI film.

In addition, an auxiliary film, such as a barrier film, a blocking film, and/or a buffer film may be disposed on the substrate 110. The auxiliary film planarizes a top surface of the substrate 110 and prevents the penetration of impurities. The auxiliary film may be formed of an inorganic insulating material, and may have a single-layer structure or a multi-layer structure. The auxiliary film may prevent the oxide semiconductor pattern 115 that is to be subsequently stacked from being contaminated with impurities from the substrate 110, thereby protecting the oxide semiconductor pattern 115 and improving interfacial properties.

The oxide semiconductor pattern 115 is disposed on the substrate 110, and includes the first oxide semiconductor region 115a and the second oxide semiconductor region 115b.

The first oxide semiconductor region 115a has semiconducting properties, and corresponds to a channel region of each TFT. The first oxide semiconductor region 115a overlaps the gate electrode 125.

The second oxide semiconductor region 115b has conductive properties, and is disposed both sides of the first oxide semiconductor region 115a. The second oxide semiconductor regions 115b correspond to a source region and a drain region of the TFT. The second oxide semiconductor region 115b may also function as a wiring line for electrically connecting the TFT to another TFT or another element. The second oxide semiconductor region 115b may obtain its conductive properties from a plasma process that uses a hydrogen-containing gas.

According to an embodiment, oxide semiconductor pattern 115 includes an oxide semiconductor material. The oxide semiconductor material may include an oxide of at least one of indium (In), gallium (Ga), stannum (Sn), zirconium (Zr), vanadium (V), hafnium (Hf), cadmium (Cd), germanium (Ge), chromium (Cr), titanium (Ti), and zinc (Zn). For example, the oxide semiconductor material may include at least one of zinc oxide (ZnO), zinc-tin oxide (ZTO), zinc-indium oxide (ZIO), indium oxide (InO), titanium oxide (TiO), indium-gallium-zinc oxide (IGZO), and indium-zinc-tin oxide (IZTO).

Since a TFT using an oxide semiconductor as an active layer has a higher mobility than a TFT using silicon (Si) as an active layer, additional ion doping for increasing mobility is not required. In addition, since a TFT that includes an oxide semiconductor has a polycrystalline and amorphous structure even at room temperature, an additional annealing process is not needed and a TFT that includes an oxide semiconductor material can be formed using a low-temperature process. In addition, since the active layer can be formed using sputtering, etc., a TFT that includes an oxide semiconductor material can be used to manufacture a large-sized substrate, as material costs may be low.

The gate insulating film 120 is disposed on the substrate 110 to cover the oxide semiconductor pattern 115. The gate insulating film 120 includes the first insulating region 120a with the first thickness da and the second insulating region 120b with the second thickness db less than the first thickness da.

According to an embodiment, the first insulating region 120a corresponds to the first oxide semiconductor region 115a, and the gate electrode 125 is disposed on the first insulating region 120a. A part, of the first insulating region 120a, such as a central portion, is covered by the gate electrode 125, and a remaining part of the first insulating region 120a, such as an edge portion, is not covered by the gate electrode 125.

According to an embodiment, the second insulating region 120b has the second thickness db and covers the second oxide semiconductor region 115b and a portion of the substrate 110 not covered by the oxide semiconductor pattern 115.

According to an embodiment, the gate insulating film 120 is formed of a silicon oxide ($SiO_2$). In this case, the second thickness db of the second insulating region 120b may range from about 500 Å to about 1000 Å. However, embodiments of the inventive concept are not limited thereto, and the gate insulating film 120 may be formed of an insulating material other than $SiO_2$, and may have a single-layer structure or a multi-layer structure.

According to an embodiment, the gate insulating film 120 can improve the interfacial properties of the oxide semiconductor pattern 115 and can prevent impurities from penetrating into the oxide semiconductor pattern 115.

According to an embodiment, the gate electrode 125 is disposed on the first insulating region 120a of the gate insulating film 120, and at least a part of the gate electrode 125 overlaps the first oxide semiconductor region 115a. The gate electrode 125 may be formed of a metal and may have a single-layer structure or a multi-layer structure. The gate electrode 125 may be formed by stacking, for example, a copper (Cu) film and titanium (Ti) layer.

According to an embodiment, the interlayer insulating film 130 is formed of an inorganic insulating material and has a single-layer structure or a multi-layer structure. Alternatively, the interlayer insulating film 130 may be formed of an organic insulating material using spin coating, etc. In addition, the interlayer insulating film 130 may have a multi-layer structure in which an organic insulating material and an inorganic insulating material are alternately disposed.

According to an embodiment, the interlayer insulating film 130 and the gate insulating film 120 have a contact hole CH through which a portion of the second oxide semiconductor region 115b of the oxide semiconductor pattern 115 is exposed.

According to an embodiment, the electrode 135 is disposed on the interlayer insulating film 130 and is electrically connected to the second oxide semiconductor region 115b through the contact plug CP in the contact hole CH in the interlayer insulating film 130 and the gate insulating film 120. The electrode 135 includes a source electrode 135a and a drain electrode 135b.

According to an embodiment, the electrode 135 is formed of, for example, a metal, and may have a single-layer structure or a multi-layer structure.

According to a present embodiment, the gate insulating film 120 includes the first insulating region 120a with the first thickness da and the second insulating region 120b with the second thickness db less than the first thickness da. The gate insulating film 120 is entirely disposed between the gate electrode 125 and the second oxide semiconductor region 115b.

In a conventional method of making the second oxide semiconductor region 115b of the oxide semiconductor pattern 115 conductive, a part of a gate insulating film 120 is removed to expose the second oxide semiconductor region 115b. In this case, the gate insulating film is disposed only between the gate electrode 125 and the first oxide semiconductor region 115a, and an interlayer insulating film covers the second oxide semiconductor region 115b. In this case, an interface between the gate insulating film and the interlayer insulating film, which is matched to a boundary between the first and second oxide semiconductor regions 115a and 115b, is formed. In this structure, if a high voltage is applied between the gate electrode 125 and the second oxide semiconductor region 115b, current can leak along the interface between the gate insulating film and the interlayer insulating film between the gate electrode 125 and the second oxide semiconductor region 115b. In addition, since the interface between the gate insulating film and the interlayer insulating film is structurally weaker than a continuous insulating film, if a high voltage is applied to the gate electrode 125, the interface between the gate insulating film and the interlayer insulating film may be destroyed, thereby causing the TFT to break down.

According to embodiments, however, since the gate insulating film 120 covers the entire oxide semiconductor pattern 115, current leakage between the gate electrode 125 and the second oxide semiconductor region 115b can be prevented. In addition, since the continuously formed gate insulating film 120 is structurally stronger than an interface between the gate insulating film 120 and the interlayer insulating film 130, the gate insulating film 120 is not easily destroyed, thereby reducing the risk of a TFT breakdown.

In addition, since the second oxide semiconductor region 115b is made conductive using plasma processing with a hydrogen-containing gas, the second oxide semiconductor region 115b does not need to be exposed. For hydrogen to penetrate into the second oxide semiconductor region 115b through plasma processing, the second thickness db of the second insulating region 120b on the second oxide semiconductor region 115b is less than the first thickness da of the first insulating region 120a. Such a structure can be formed without an additional mask.

FIGS. 2A through 2H are cross-sectional views that sequentially illustrate a method of manufacturing a TFT, according to an embodiment.

Figure 2A:
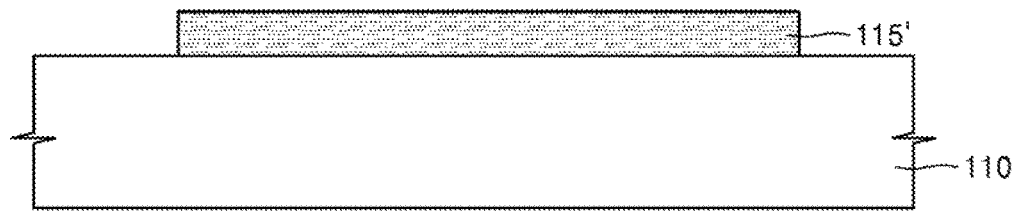

Referring to FIG. 2A, a first oxide semiconductor pattern 115' is formed on the substrate 110.

The substrate 110 has a flat top surface and may be formed of a transparent insulating material, such as glass. Alternatively, the substrate 110 may be formed of a flexible plastic material such as a PI film to realize a flexible display apparatus. Alternatively, the substrate 110 may be formed of an opaque material such as a metal or a carbon fiber.

According to an embodiment, to prevent impurities from penetrating from the substrate 110 into the first oxide semiconductor pattern 115' that is to be subsequently stacked, and thus to protect the first oxide semiconductor pattern 115' and improve its interfacial properties, an auxiliary film, such as a barrier film, a blocking film, and/or a buffer film, may be disposed on the substrate 110. The auxiliary film may be formed of an insulating oxide such as silicon oxide ($SiO_x$), silicon nitride ($SiN_x$), aluminum oxide ($Al_2O_3$), hafnium oxide ($HfO_3$), or yttrium oxide ($Y_2O_3$) to have a multi-layer structure or a single-layer structure. The auxiliary film may be formed by any appropriate deposition method, such as plasma-enhanced chemical vapor deposition (PECVD), atmospheric pressure CVD (APCVD), or low-pressure CVD (LPCVD).

According to an embodiment, the first oxide semiconductor pattern 115' is formed on the substrate 110. An oxide semiconductor layer 115' is formed on the substrate 110, after which the first oxide semiconductor pattern 115' is formed using photolithography and etching, as shown in FIG. 2A.

The oxide semiconductor material may include an oxide of at least one of In, Ga, Sn, Zr, V, Hf, Cd, Ge, Cr, Ti, and Zn. For example, the oxide semiconductor material may include at least one of ZnO, ZTO, ZIO, InO, TiO, IGZO, and IZTO. For example, the oxide semiconductor material may include In, Ga, and Zn in an atomic ratio of 2:2:1.

However, embodiments of the inventive concept are not limited thereto, and the oxide semiconductor material may include a quaternary metal oxide such as a In—Sn—Ga—Zn—O-based material, a ternary metal oxide such as a In—Ga—Zn—O-based material, a In—Sn—Zn—O-based material, a In—Al—Zn—O-based material, a Sn—Ga—Zn—O-based material, a Al—Ga—Zn—O-based material, a Sn—Al—Zn—O-based material, or a Cd—Sn—O-based material, a binary metal oxide such as a In—Zn—O-based material, a Sn—Zn—O-based material, a Al—Zn—O-based material, a Zn—Mg—O-based material, a Sn—Mg—O-based material, or a In—Mg—O-based material, or a unary metal oxide such as a In—O-based material, a Sn—O-based material, a Zn—O-based material, a Ti—O-based material, or a Cd—O-based material. A In—Ga—Zn—O-based oxide semiconductor may include at least In, Ga, and Zn, irrespective of the composition ratio, and may also include one or more elements other than In, G, and Zn.

Figure 2B:
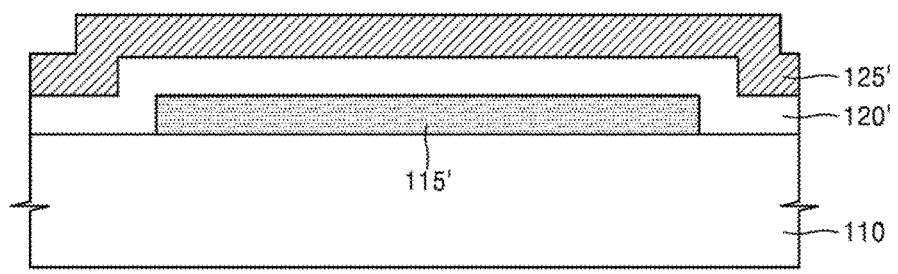

Referring to FIG. 2B, according to an embodiment, a first insulating layer 120' and a first metal layer 125' are sequentially stacked on the substrate 110 to cover the first oxide semiconductor pattern 115'.

According to an embodiment, the first insulating material layer 120' is deposited on the substrate 110 on which the first oxide semiconductor pattern 115' is formed. The first insulating material layer 120' may be formed of $SiO_2$. However, embodiments of the inventive concept are not limited thereto, and the first insulating material layer 120' may be formed of an inorganic insulating material such as silicon nitride (SiNO, aluminum oxide ($Al_2O_3$), copper oxide ($CuO_x$), terbium oxide ($Tb_4O_7$), yttrium oxide ($Y_2O_3$), niobium oxide ($Nb_2O_5$), or praseodymium oxide ($Pr_2O_3$) in a single-layer structure or a multi-layer structure. The first insulating material layer 120' may be formed by any appropriate deposition method, such as PECVD, APCVD, or LPCVD.

According to an embodiment, the first metal material layer 125' is deposited on the first insulating material layer 120'. The first metal material layer 125' is formed of at least one metal material selected from silver (Ag), magnesium (Mg), aluminum (Al), platinum (Pt), lead (Pb), gold (Au), nickel (Ni), neodymium (Nd), iridium (Ir), chromium (Cr), lithium (Li), calcium (Ca), molybdenum (Mo), titanium (Ti), tungsten (W), and copper (Cu). The first metal material layer 125' can be formed by stacking, for example, a Cu film and a Ti film.

Figure 2C:
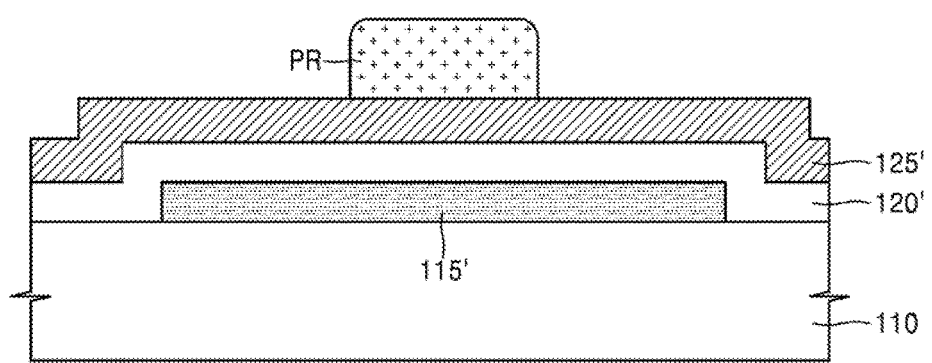

Referring to FIG. 2C, according to an embodiment, a photosensitive pattern PR is formed on the first metal material layer 125'.

According to an embodiment, a photosensitive organic material layer is stacked on the first metal material layer 125', after which the photosensitive pattern PR can be formed by exposure or development using a photomask, as shown in FIG. 2C.

Examples of a photosensitive organic material include an olefin-based organic material, an acryl-based organic material, and an imide-based organic material. For example, the photosensitive organic material may include PI. The photosensitive organic material may be a positive photosensitive material of which an exposed portion is removed, or a negative photosensitive material of which an exposed portion is hardened.

Figure 2D:
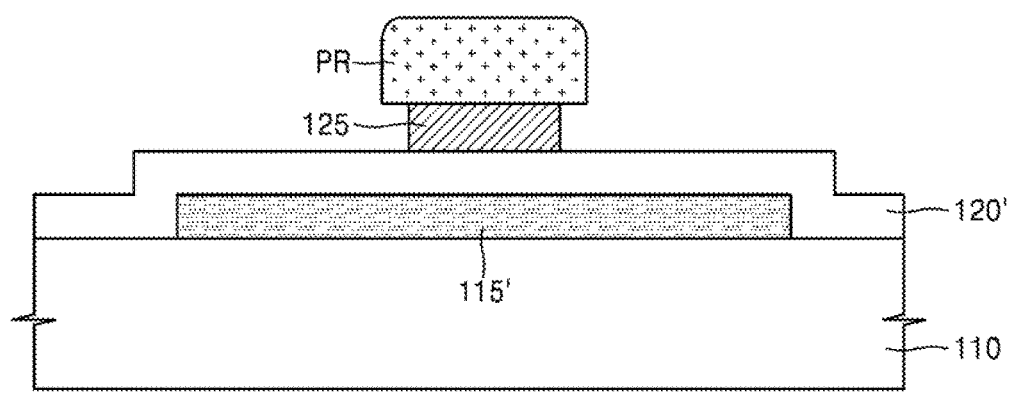

Referring to FIG. 2D, according to an embodiment, the first metal material layer 125' is etched using the photosensitive pattern PR as a mask. The first metal layer 125' can be isotropically wet etched using an etchant. As a result, the gate electrode 125 corresponding to the photosensitive pattern PR can be formed as shown in FIG. 2D. At least a part of the gate electrode 125 overlaps the first oxide semiconductor region 115a of the oxide semiconductor pattern 115 of FIG. 1.

According to an embodiment, the first metal material layer 125' is etched more than the mask during the wet etching. As a result, a side surface of the gate electrode 125 is disposed inward from a side surface of the photosensitive pattern PR.

Figure 2E:
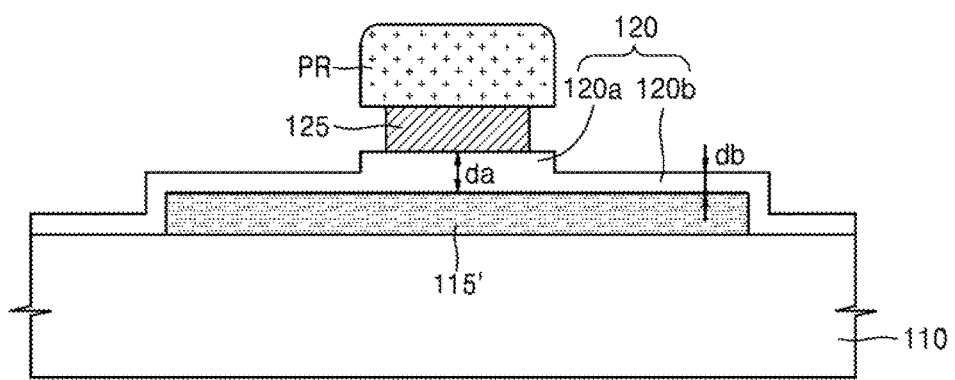

Referring to FIG. 2E, according to an embodiment, the first insulating material layer 120' is partially etched using the photosensitive pattern PR as a mask. A portion of the first insulating material layer 120' disposed under the photosensitive pattern PR is not etched, and a portion of the first insulating material layer 120' not covered by the photosensitive pattern PR is slightly etched. As a result, the first insulating region 120a of the gate insulating film 120 with the first thickness da is formed under the photosensitive pattern PR along with the second insulating region 120b with the second thickness db less than the first thickness da.

When the gate insulating film 120 is formed of $SiO_2$, the second thickness db of the second insulating region 120b ranges from about 500 Å to about 1000 Å. When the second thickness db is less than or equal to 500 Å, the first oxide semiconductor region 115a of the oxide semiconductor pattern 115 may become conductive during a subsequent hydrogen gas plasma process. In addition, when the second thickness db is greater than or equal to 1000 Å, the second oxide semiconductor region 115b of the oxide semiconductor pattern 115 may not become conductive from the subsequent hydrogen gas plasma process.

According to an embodiment, isotropic dry etching is performed on the first insulating material layer 120' using the photosensitive pattern PR as a mask. Due to the isotropic dry etching, a boundary between the first insulating region 120a and the second insulating region 120b may correspond to an edge of the photosensitive pattern PR. Accordingly, the gate electrode 125 is disposed on a part, that is, a central portion, of the first insulating region 120a and a remaining part, that is, an edge portion, of the first insulating region 120a will be exposed.

Referring to FIG. 2F, according to an embodiment, plasma processing is performed on the structure of FIG. 2E on the substrate 110. The plasma processing may be performed using a hydrogen-containing gas.

As a result, the oxide semiconductor pattern 115 that includes a semiconducting first oxide semiconductor region 115a and a conductive second oxide semiconductor region 115b is formed.

According to an embodiment, the second oxide semiconductor region 115b of the oxide semiconductor pattern 115 becomes conductive due to the hydrogen plasma. The oxide semiconductor material of the second oxide semiconductor region 115b becomes conductive by being reduced due to the hydrogen plasma. In this case, since the photosensitive pattern PR functions as a mask, the first oxide semiconductor region 115a disposed under the first insulating region 120a does not become conductive due to the plasma.

The second insulating region 120b having the relatively small second thickness db is disposed on the second oxide semiconductor region 115b, Accordingly, hydrogen can diffuse through the second insulating region 120b during plasma processing into the second oxide semiconductor region 115b, and the oxide semiconductor material of the second oxide semiconductor region 115b is reduced by reacting with the hydrogen. For the oxide semiconductor material to become conductive using plasma processing, the second thickness db should be less than or equal 1000 Å.

If the second thickness db is less than 500 Å, the first oxide semiconductor region 115a of the oxide semiconductor pattern 115a will also become conductive during the hydrogen plasma processing. As a result, the entire oxide semiconductor pattern 115 can be made conductive, thereby causing the TFT to fail to function.

Plasma processing is a process of modifying chemical or physical properties of a material's surface allowing high energy plasma particles to collide with the material's surface. According to an embodiment of the inventive concept, a hydrogen-containing gas can be used for plasma processing. The gas may further contain at least one of argon, helium, xenon, nitrogen, nitric oxide, and oxygen, in addition to hydrogen.

Since an oxide semiconductor is reduced by having plasma processing performed thereon, an oxygen vacancy in the oxide semiconductor is induced and increased. The increased oxygen vacancy increases a carrier concentration of the oxide semiconductor material. As a result, the oxide semiconductor material becomes conductive and easily conducts electricity therethrough.

Figure 2G:
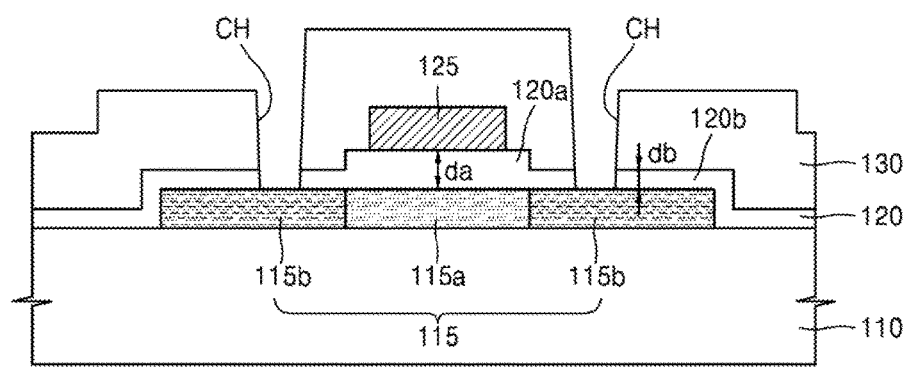

Referring to FIG. 2G, according to an embodiment, the photosensitive pattern PR is removed from the gate electrode 125. The photosensitive pattern PR may be removed by ashing.

Next, according to an embodiment, a second insulating material layer is stacked on the gate insulating film 120 and the gate electrode 125. The second insulating material layer may include an inorganic insulating material such as $SiO_2$, $SiN_x$, $Al_2O_3$, $CuO_x$, $Tb_4O_7$, $Y_2O_3$, $Nb_2O_5$, or $Pr_2O_3$. The second insulating material may have a single-layer structure or a multi-layer structure. The second insulating material layer may be formed using any appropriate deposition method, such as PECVD, APCVD, or LPCVD.

Alternatively, the second insulating material layer may be formed of at least one organic insulating material selected from polyimide, polyimide, acrylic resin, benzocyclobutene, and phenolic resin using spin coating, etc. In addition, the second insulating material layer may have a multi-layer structure in which an organic insulating material and an inorganic insulating material are alternately disposed.

Next, according to an embodiment, photolithography and etching are performed on the the second insulating material layer and gate insulating film 120, and the interlayer insulating film 130 is formed with the contact hole CH through which a part of the second oxide semiconductor region 115b is exposed.

Figure 2H:
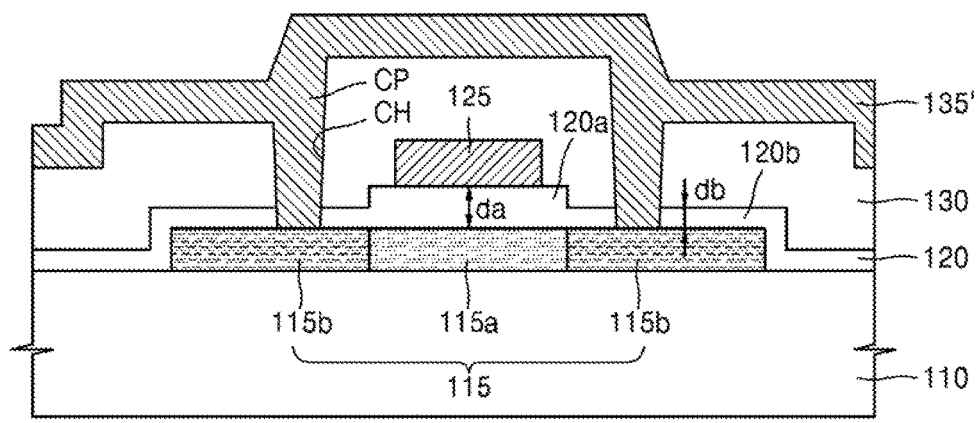

Referring to FIG. 2H, according to an embodiment, a second metal layer 135', including the contact plug CP that fills the contact hole CH in the gate insulating film 120 and the interlayer insulating film 130 is stacked on the interlayer insulating film 130. The contact plug CP is electrically connected to the second oxide semiconductor region 115b.

The second metal material layer 135' may be formed of at least one of Ag, Mg, Al, Pt, Pb, Au, Ni, Nd, Ir, Cr, Li, Ca, Mo, Ti, W, and Cu. The second metal material layer 135' may have a single-layer structure or a multi-layer structure.

Referring to FIG. 1, the electrode 135 is formed that is electrically connected to the second oxide semiconductor region 115b through the contact plug CP in the contact hole CH, by performing photolithography and etching on the second metal material layer 135'. The electrode 135 includes the source electrode 135a and the drain electrode 135b.

Figure 3:
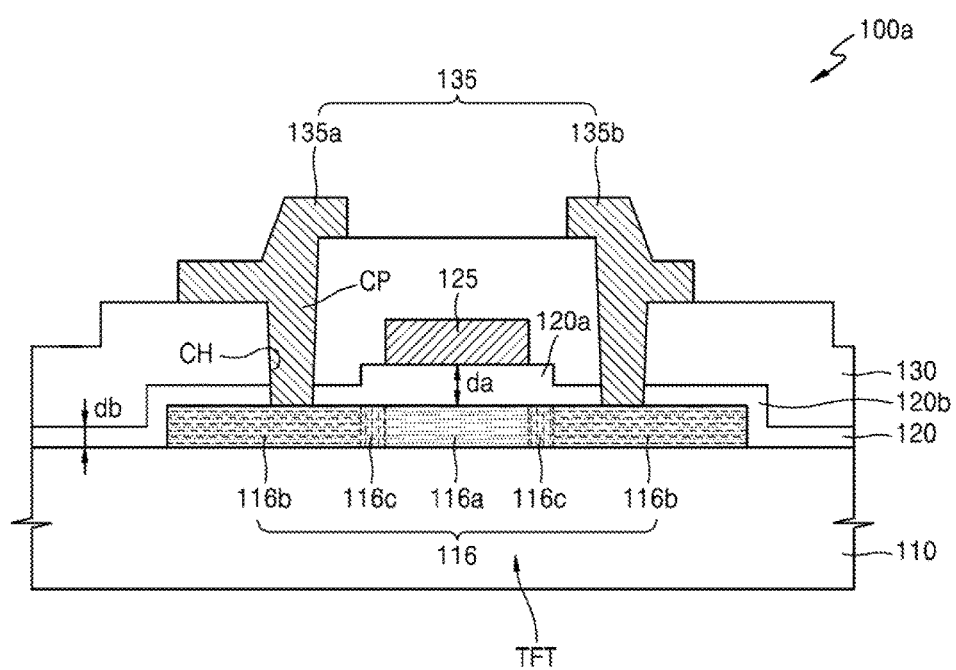
FIG. 3 is a cross-sectional view of a TFT substrate according to another embodiment.

FIG. 3 is a cross-sectional view of a TFT substrate 100a according to another embodiment.

Referring to FIG. 3, a TFT substrate 100a includes the substrate 110, an oxide semiconductor pattern 116, the gate insulating film 120, the gate electrode 125, the interlayer insulating film 130, and the electrode 135.

The TFT substrate 100a is substantially the same as the TFT substrate 100 of FIG. 1 except for the oxide semiconductor pattern 116. A repeated explanation of the same elements as those in FIG. 1 will not be given.

The oxide semiconductor pattern 116 includes a first oxide semiconductor region 116a, second oxide semiconductor regions 116b, and third oxide semiconductor regions 116c. The first oxide semiconductor region 116a is disposed between the second oxide semiconductor regions 116b. Each third oxide semiconductor region 116c is disposed between the first oxide semiconductor region 116a and one of the second oxide semiconductor regions 116b.

According to an embodiment, resistance of the third oxide semiconductor region 116c is less than a resistance of the first oxide semiconductor region 116a and greater than a resistance of the second oxide semiconductor region 116b. Since the second oxide semiconductor region 116b is conductive, the second oxide semiconductor region 116b has a very low resistance. Since the first oxide semiconductor region 116a is a semiconductor, the first oxide semiconductor region 116a has a resistance between that of a conductor and an insulator. Since the third oxide semiconductor region 116c has a resistance that is less than that of the first oxide semiconductor region 116a and greater than that of the second oxide semiconductor region 116b, a strong electric field may be prevented from forming between the first oxide semiconductor region 116a and the second oxide semiconductor region 116b. Accordingly, the possibility that characteristics of the TFT, such as a threshold voltage of the TFT, change due to a strong electric field can be reduced, thereby improving reliability.

As described above, the gate insulating film 120 includes the first insulating region 120a with the first thickness da and the second insulating region 120b with the second thickness db less than the first thickness da. The gate electrode 125 is disposed on a part of the first insulating region 120a. The first insulating region 120a includes a central portion covered by the gate electrode 125 and an edge portion not covered by the gate electrode 125.

According to an embodiment, the first oxide semiconductor region 116a is disposed under the central portion of the first insulating region 120a covered by the gate electrode 125. That is, a boundary between the first oxide semiconductor region 116a and the third oxide semiconductor region 116c can be defined by the edge of the gate electrode 125.

According to an embodiment, the third oxide semiconductor region 116c is disposed under the edge portion of the first insulating region 120a not covered by the gate electrode 125. That is, a boundary between the third oxide semiconductor region 116c and the second oxide semiconductor region 116b can be defined by a stepped portion of the gate insulating film 120, that is, a boundary between the first insulating region 120a and the second insulating region 120b.

According to an embodiment, the second oxide semiconductor region 116b is disposed under the second insulating region 120b.

Figure 4:
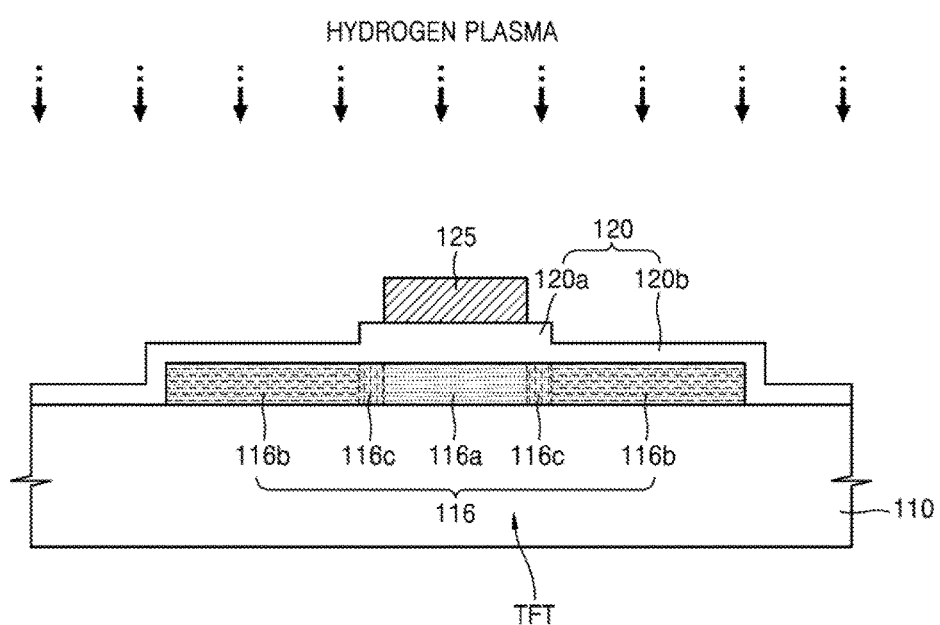
FIG. 4 is a cross-sectional view that illustrates a method of manufacturing a TFT of FIG. 3.

FIG. 4 is a cross-sectional view that illustrates a method of manufacturing a TFT of FIG. 3.

The TFT of the TFT substrate 100a can be formed using processes of a method described with reference to FIGS. 2A through 2E. Next, a process of FIG. 4 can be performed. Next, processes of the method described with reference to FIGS. 2G through 2H can be performed.

First, referring to FIG. 2E, the gate insulating film 120 is formed that includes the first insulating region 120a and the second insulating region 120b, by partially etching the first insulating material layer 120' using the photosensitive pattern PR as a mask.

Referring to FIG. 4, according to an embodiment, the photosensitive pattern PR is removed from the gate electrode 125. The photosensitive pattern PR can be removed by ashing.

According to an embodiment, plasma processing is performed on a structure formed on the substrate 110. The plasma processing can be performed using a hydrogen-containing gas. As a result, the oxide semiconductor pattern 116 is formed, including the first oxide semiconductor region 116a under a central portion of the first insulating region 120a covered by the gate electrode 125, the third oxide semiconductor region 116c under an edge portion of the first insulating region 120a not covered by the gate electrode 125, and the conducting second oxide semiconductor region 116c under the second insulating region 120b.

According to an embodiment, the third oxide semiconductor region 116c corresponds to the edge portion of the first insulating region 120a and is disposed between the first oxide semiconductor region 116a and the second oxide semiconductor region 116b.

According to an embodiment, the second oxide semiconductor region 116b and the third oxide semiconductor region 116c of the oxide semiconductor pattern 116 become conductive due to a hydrogen-based plasma. Oxide semiconductor materials of the second oxide semiconductor region 116b and the third oxide semiconductor region 116c become conducting by being reduced by the hydrogen-based plasma. In this case, since the gate electrode 125 functions as a mask, the first oxide semiconductor region 116a disposed under the central portion of the first insulating region 120a unaffected by the plasma.

The second insulating region 120b, which as a relatively small second thickness db, is disposed on the second oxide semiconductor region 116b. Accordingly, hydrogen can diffuse through the second insulating region 120b during plasma processing into the second oxide semiconductor region 116b, and the hydrogen reacts with and reduces the oxide semiconductor material of the second oxide semiconductor region 116b.

The first insulating region 120a, which has a relatively greater first thickness da, is disposed on the third oxide semiconductor region 116c. Accordingly, less hydrogen can diffuse through the first insulating region 120a than that through the second insulating region 120b. A smaller amount of hydrogen can diffuse into the third oxide semiconductor region 116c than into the second oxide semiconductor region 116b. Accordingly, although the third oxide semiconductor region 116c also becomes conductive, since the third oxide semiconductor region 116c is less conductive than the second oxide semiconductor region 116b, the third oxide semiconductor region 116c has a resistance greater than that of the second oxide semiconductor region 116b.

Referring back to FIG. 2G, according to an embodiment, the interlayer insulating film 130, which has the contact hole CH through which a part of the second oxide semiconductor region 116b is exposed, is formed on the gate insulating film 120 and the gate electrode 125.

Figure 5:
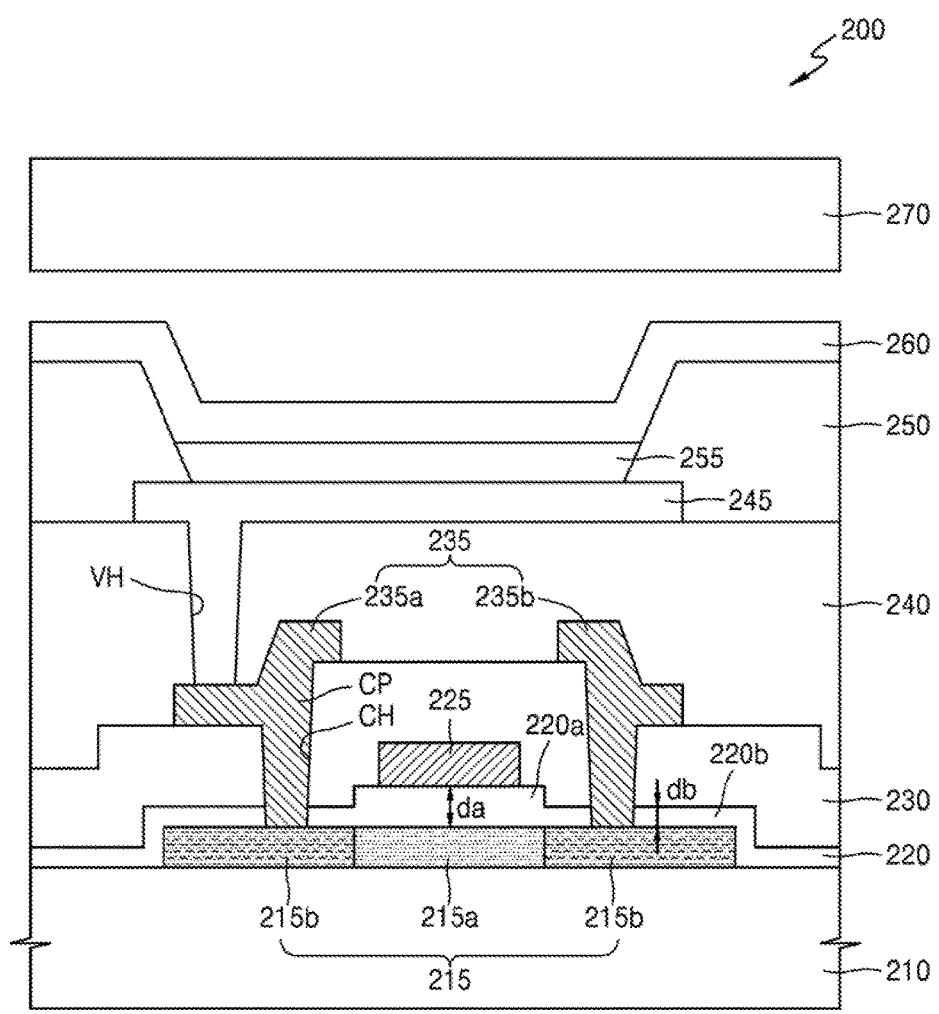
FIG. 5 is a cross-sectional view of an organic light-emitting diode display apparatus according to an embodiment.

FIG. 5 is a cross-sectional view of an organic light-emitting diode display apparatus 200 according to an embodiment.

Referring to FIG. 5, an organic light-emitting diode display apparatus 200 includes a substrate 210, an oxide semiconductor pattern 215, a gate insulating film 220, a gate electrode 225, an interlayer insulating film 230, an electrode 235, a pixel electrode 245, a pixel defining film 250, an organic emission layer 255, and a counter electrode 260.

The oxide semiconductor pattern 215 is disposed on the substrate 210, includes a semiconducting first oxide semiconductor region 215a and a conductive second oxide semiconductor region 215b, and corresponds to the oxide semiconductor pattern 115 of FIG. 1. The oxide semiconductor pattern 215 may be replaced with the oxide semiconductor pattern 116 of FIG. 3. The gate insulating film 220 is disposed on the substrate 210 to cover the oxide semiconductor pattern 215, includes a first insulating region 220a with a first thickness da and a second insulating region 220b with a second thickness db less than the first thickness da, and corresponds to the gate insulating film 120 of FIG. 1.

The gate electrode 225 is disposed on the first insulating region 220a, has at least a part that overlaps the first oxide semiconductor region 215a, and corresponds to the gate electrode 125 of FIG. 1. The interlayer insulating film 230 is disposed on the gate insulating film 220 to cover the gate electrode 225 and corresponds to the interlayer insulating film 130 of FIG. 1. The electrode 235 is disposed on the interlayer insulating film 230, is electrically connected to the second oxide semiconductor region 220b through a contact plug CP that penetrates the interlayer insulating film 230 and the gate insulating film 220, and corresponds to the electrode 135 of FIG. 1. The electrode 235 includes a source electrode 235a and a drain electrode 235b.

The substrate 210, the oxide semiconductor pattern 215, the gate insulating film 220, the gate electrode 225, the interlayer insulating film 230, and the electrode 235 respectively correspond to the substrate 110, the oxide semiconductor pattern 115, the gate insulating film 120, the gate electrode 125, the interlayer insulating film 130, and the electrode 135 of FIGS. 1 and 3, and thus a repeated explanation thereof will not be given.

According to an embodiment, the organic light-emitting display apparatus 200 includes a protective layer 240 that covers the interlayer insulating film 230 and the electrode 235. The protective layer 240 has a via-hole VH through which a part of the electrode 235 is exposed. The via-hole VH can be formed using photolithography and etching.

The protective layer 240 may be formed of an organic insulating material selected from polyimide, polyamide, acrylic resin, benzocyclobutene, and phenolic resin using spin coating, etc. According to an embodiment, the protective layer 240 has a flat top surface, which can prevent defects of a subsequently formed organic light-emitting diode device.

According to an embodiment, the organic light-emitting diode display apparatus 200 includes the pixel electrode 245 formed on the protective layer 240, the counter electrode 260, and the organic emission layer 255. The pixel electrode 245 can be used as an anode of an OLED and the counter electrode 260 can be used as a cathode of an OLED. However, embodiments of the inventive concept are not limited thereto, and the pixel electrode 245 and the counter electrode 260 may be respectively a cathode and an anode.

The OLED can emit light at a luminance corresponding to a driving current received from the TFT.

According to an embodiment, the pixel electrode 245 is formed on the protective layer 240 and is electrically connected to the TFT, for example, the source electrode 235a, through the via-hole VH in the protective layer 240. The pixel electrode 245 may be formed of any material suitable for an emission type organic light-emitting display apparatus 200. For example, when the organic light-emitting display apparatus 200 is a bottom-emission display apparatus in which an image is displayed in a direction toward the substrate 210 or a dual-emission display apparatus in which an image is displayed in both directions, the pixel electrode 245 can be formed of a transparent metal oxide. The pixel electrode 245 may include at least one material selected from transparent conductive oxides such as ITO, IZO, ZnO, and $In_2O_3$. When the organic light-emitting display apparatus 200 is a top-emission display apparatus in which an image is displayed in a direction away from the substrate 210, the pixel electrode 245 further includes a reflective electrode formed of a light-reflecting material. Although the pixel electrode 245 and the electrode 235 are separate elements in FIG. 5, according to an embodiment, the pixel electrode 245 and the electrode 235 may be integrally formed with each other.

According to an embodiment, the organic light-emitting display apparatus 200 includes a pixel-defining film 250 that defines a light-emitting portion by exposing a part of the pixel electrode 245 on the protective layer 240.

According to an embodiment, the organic emission layer 255 is disposed on the part of the pixel electrode 245 exposed by the pixel-defining film 250. The organic emission layer 255 is disposed between the pixel electrode 245 and the counter electrode 260. At least one functional layer, such as a hole transport layer (HTL), a hole injection layer (HIL), an electron transport layer (HTL), and an electron injection layer (EIL), in addition to the organic emission layer 255, may be disposed on the pixel electrode 245 and may have a single-layer structure or a multi-layer structure.

According to an embodiment, the counter electrode 260 faces the pixel electrode 245. The counter electrode 260 can be formed as a common electrode by being entirely deposited on the substrate 210. The counter electrode 260 may be formed by thinly depositing one of Ag, Mg, Al, Pt, Pb, Au, Ni, Nd, Ir, Cr, Li, Ca, lithium fluoride (LiF), and/or a compound thereof. The counter electrode 260 may include a reflective electrode and/or a semi-transparent electrode, based on a light emitting direction.

According to an embodiment, the organic light-emitting display apparatus 200 further includes a capping layer disposed on the counter electrode 260 that includes an inorganic material to protect the counter electrode 260. The organic light-emitting display apparatus 200 includes an encapsulation substrate 270 that faces the substrate 210 and encapsulates the substrate 210 using an encapsulating member, to prevent oxygen and moisture from being externally introduced. Alternatively, the organic light-emitting display apparatus 200 may include a thin film encapsulation layer formed by alternately stacking at least one organic film and at least one inorganic film, instead of the encapsulation substrate 270.

Figure 6:
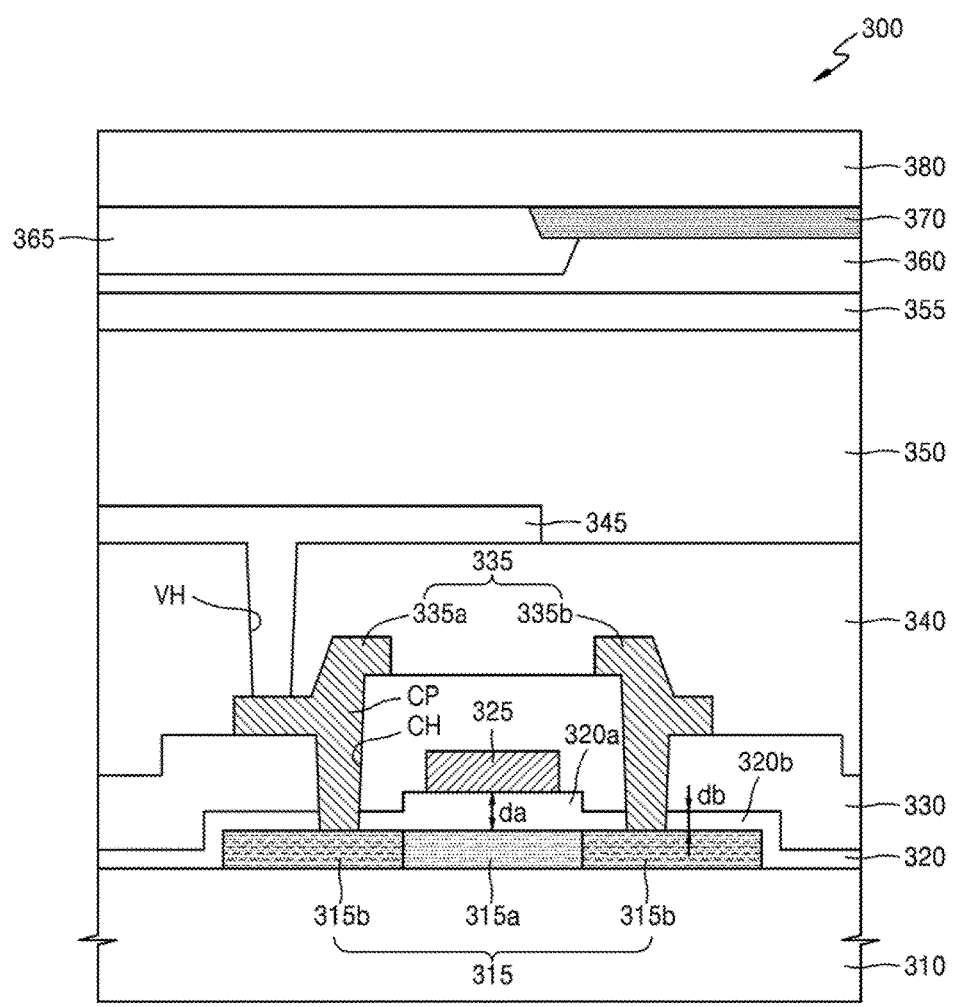
FIG. 6 is a cross-sectional view of a liquid crystal display (LCD) apparatus according to an embodiment.

FIG. 6 is a cross-sectional view of an LCD apparatus 300 according to an embodiment.

Referring to FIG. 6, an LCD apparatus 300 includes a substrate 310, an oxide semiconductor pattern 315, a gate insulating film 320, a gate electrode 325, an interlayer insulating film 330, an electrode 335, a protective layer 340, a pixel electrode 345, a liquid crystal layer 350, and a counter electrode 355.

The oxide semiconductor pattern 315 is disposed on the substrate 310, includes a semiconducting first oxide semiconductor region 315a and a conducting second oxide semiconductor region 315b, and corresponds to the oxide semiconductor pattern 115 of FIG. 1. The oxide semiconductor pattern 315 may be replaced with the oxide semiconductor pattern 116 of FIG. 3. The gate insulating film 320 is disposed on the substrate 310 to cover the oxide semiconductor pattern 315, includes a first insulating region 320a with a first thickness da and a second insulating region 320b with a second thickness db less than the first thickness da, and corresponds to the gate insulating film 120 of FIG. 1.

The gate electrode 325 is disposed on the first insulating region 320a, has at least a part that overlaps the first oxide semiconductor region 315a, and corresponds to the gate electrode 125 of FIG. 1. The interlayer insulating film 330 is disposed on the gate insulating film 330 to cover the gate electrode 325 and corresponds to the interlayer insulating film 130 of FIG. 1. The electrode 335 is disposed on the interlayer insulating film 330, is electrically connected to the second oxide semiconductor region 320b through a contact plug CP that penetrates the interlayer insulating film 330 and the gate insulating film 320, and corresponds to the electrode 135 of FIG. 1. The electrode 335 includes a source electrode 335a and a drain electrode 335b.

The substrate 310, the oxide semiconductor pattern 315, the gate insulating film 320, the gate electrode 325, the interlayer insulating film 330, and the electrode 335 respectively correspond to the substrate 110, the oxide semiconductor pattern 115, the gate insulating film 120, the gate electrode 125, the interlayer insulating film 130, and the electrode 135 of FIGS. 1 and 3, and thus a repeated explanation thereof will not be given.

According to an embodiment, the LCD apparatus 300 further includes the protective layer 340, the pixel electrode 345, the liquid crystal layer 350, the counter electrode 355, a planarization layer 360, a color filter 365, a black matrix 370, and a counter substrate 380.

According to an embodiment, the protective layer 340 covers the interlayer insulating film 330 and the electrode 335, and has a via-hole VH through which a part of the electrode 335 is exposed. The protective layer 240 can be formed of an organic insulating material using spin coating, etc., and has a flat top surface.

According to an embodiment, the liquid crystal layer 350 is disposed between the substrate 310 on which a TFT is formed and the counter substrate 380 on which the counter electrode 355 and the color filter 365 are formed.

According to an embodiment, the black matrix 370, the color filter 365, the planarization layer 360, and the counter electrode 355 are sequentially formed on the counter substrate 380.

According to an embodiment, the black matrix 370 blocks light that is unnecessary to form an image. The black matrix 370 can block light leakage of light caused by abnormal liquid crystal molecule behaviors along a pixel edge or mixed colors along a color filter 365 edge.

According to an embodiment, the color filter 365 imparts color to light that propagates through a pixel. The color filter 365 can be one of a red filter, a green filter, and a blue filter.

According to an embodiment, the planarization layer 360 covers the black matrix 370 and the color filter 365. The planarization layer 360 can be formed of an organic insulating material using spin coating, etc., and has a flat top surface.

According to an embodiment, the counter electrode 355 is formed of a transparent conductive material, and may be referred to as a common electrode. For example, the counter electrode 355 may be formed of a transparent conductive metal oxide such as ITO, IZO, or ITZO.

According to an embodiment, the pixel electrode 345 receives a pixel signal from the source electrode 335a of the TFT and a potential difference is formed between the pixel electrode 345 and the counter electrode 355. Once the potential difference is formed, the molecules of the liquid crystal layer 350 rotate due to dielectric anisotropy, which controls the amount of light than can propagate through the liquid crystal layer 350. Light is incident to the the liquid crystal layer 350 from a light source. Thus the amount of light emitted from the liquid crystal layer 350 can be adjusted by adjusting the potential difference between the pixel electrode 345 and the counter electrode 355, thereby enabling light with a desired luminance and a desired color to be emitted.

According to a method of manufacturing the TFT according to one or more embodiments, since a gate insulating film having thicknesses that differ according to regions entirely covers an oxide semiconductor pattern, current may be prevented from leaking between a gate and a drain, which can reduce the risk of a breakdown of the TFT. Since no mask is added, manufacturing costs can be decreased. Accordingly, the TFT can reliably operate with a long lifespan.

While one or more exemplary embodiments have been described with reference to the figures, it will be understood by those of ordinary skill in the art that various changes in form and details may be made therein without departing from the spirit and scope as defined by the following claims.

What is claimed is:

1. A method of manufacturing a thin-film transistor (TFT), the method comprising:
    forming an oxide semiconductor pattern on a substrate;
    sequentially stacking an insulating material layer and a metal layer on the substrate that covers the oxide semiconductor pattern;
    forming a photosensitive pattern on the metal layer;
    forming a gate electrode by wet etching the metal layer using the photosensitive pattern as a mask, wherein a side surface of the gate electrode is disposed inward from a side surface of the photosensitive pattern, and wherein at least one part of the gate electrode overlaps a first oxide semiconductor region of the oxide semiconductor pattern;
    forming a gate insulating film by partially etching the insulating material layer using the photosensitive pattern as a mask, wherein the gate insulating film includes a first insulating region with a first thickness under the photosensitive pattern and a second insulating region with a second thickness less than the first thickness; and
    performing plasma processing on the gate insulating film wherein a second oxide semiconductor region of the oxide semiconductor pattern under the second insulating region becomes conductive.

2. The method of claim 1, wherein the plasma processing uses a hydrogen-containing gas.

3. The method of claim 1, wherein the second thickness ranges from about 500 Å to about 1000 Å.

4. The method of claim 1, further comprising:
    removing the photosensitive pattern;
    forming an interlayer insulating film on the gate electrode and the gate insulating film;

forming a contact hole through which a part of the second oxide semiconductor region is exposed, by etching the gate insulating film and the interlayer insulating film; and forming an electrode through the contact hole that is electrically connected to the exposed part of the second oxide semiconductor region.

5. The method of claim 1, wherein forming of gate insulating film comprises partially dry etching the insulating material layer using the photosensitive pattern as a mask, wherein an edge of the photosensitive pattern corresponds to a boundary between the first and second insulating regions.

6. The method of claim 1, wherein the first insulating region comprises a central portion covered by the gate electrode and an edge portion not covered by the gate electrode.

7. The method of claim 6, wherein performing the plasma processing comprises:

removing the photosensitive pattern; and performing plasma processing using the gate electrode as a mask to form the oxide semiconductor pattern comprising the first oxide semiconductor region under the central portion of the first insulating region, a third oxide semiconductor region under the edge portion of the first insulating region, and the conductive second oxide semiconductor region under the second insulating region, wherein the third semiconductor region has a resistance less than a resistance of the first oxide semiconductor region and greater than a resistance of the second oxide semiconductor region.

8. A thin-film transistor (TFT) substrate comprising:

a substrate;

an oxide semiconductor pattern disposed on the substrate and comprising a semiconducting first oxide semiconductor region and a conductive second oxide semiconductor region, wherein the oxide semiconductor pattern comprises a third oxide semiconductor region disposed between the first and second oxide semiconductor regions and that has a resistance less than a resistance of the first oxide semiconductor region and greater than a resistance of the second oxide semiconductor region;

a gate insulating film disposed on the substrate that covers the oxide semiconductor pattern and that comprises a first insulating region with a first thickness and a second insulating region with a second thickness less than the first thickness;

a gate electrode disposed on the first insulating region, wherein at least a part of the gate electrode overlaps the first oxide semiconductor region; and an interlayer insulating film disposed on the gate insulating film that covers the gate electrode, wherein the second oxide semiconductor region became conductive from a hydrogen gas based plasma process performed on the gate electrode and gate insulating film.

9. The TFT substrate of claim 8, further comprising an electrode disposed in the interlayer insulating film and that is electrically connected to the second oxide semiconductor region through a contact plug that penetrates the interlayer insulating film and the gate insulating film.

10. The TFT substrate of claim 8, wherein the second thickness ranges from about 500 Å to about 1000 Å.

11. The TFT substrate of claim 8, wherein the first insulating region comprises a central portion covered by the gate electrode and an edge portion not covered by the gate electrode.

12. A flat panel display apparatus comprising:

a substrate;

an oxide semiconductor pattern disposed on the substrate and that comprises a semiconducting first oxide semiconductor region and a conductive second oxide semiconductor region, wherein the oxide semiconductor pattern comprises a third oxide semiconductor region disposed between the first and second oxide semiconductor regions and that has a resistance less than a resistance of the first oxide semiconductor region and greater than a resistance of the second oxide semiconductor region;

a gate insulating film disposed on the substrate that covers the oxide semiconductor pattern and that comprises a first insulating region with a first thickness and a second insulating region with a second thickness less than the first thickness;

a gate electrode disposed on the first insulating region, wherein at least a part of the gate electrode overlaps the first oxide semiconductor region;

an interlayer insulating film disposed on the gate insulating film that covers the gate electrode; and an electrode disposed in the interlayer insulating film that is electrically connected to the second oxide semiconductor region through a contact plug that penetrates the interlayer insulating film and the gate insulating film.

13. The flat panel display apparatus of claim 12, wherein the second oxide semiconductor region becomes conductive from a hydrogen gas based plasma process performed on the gate electrode and gate insulating film.

14. The flat panel display apparatus of claim 12, wherein the second thickness ranges from about 500 Å to about 1000 Å.

15. The flat panel display apparatus of claim 12, wherein the first insulating region comprises a central portion covered by the gate electrode and an edge portion not covered by the gate electrode.

16. The flat panel display apparatus of claim 12, further comprising:

a pixel electrode electrically connected to the electrode;

a counter electrode that faces the pixel electrode; and an organic emission layer disposed between the pixel electrode and the counter electrode.

17. The flat panel display apparatus of claim 12, further comprising:

a pixel electrode electrically connected to the electrode;

a counter electrode that faces the pixel electrode; and a liquid crystal layer disposed between the pixel electrode and the counter electrode.

* * * * *